United States Patent
Fujii et al.

(10) Patent No.: US 7,400,200 B2
(45) Date of Patent: Jul. 15, 2008

(54) LINEAR VARIABLE GAIN TRAVELING WAVE AMPLIFIER

(75) Inventors: Kohei Fujii, San Jose, CA (US); Michael L. Frank, Los Gatos, CA (US)

(73) Assignee: Avago Technologies Wireless IP Pte Ltd, Singapore (SG)

( * ) Notice: Subject to any disclaimer, the term of this patent is extended or adjusted under 35 U.S.C. 154(b) by 160 days.

(21) Appl. No.: 11/378,986

(22) Filed: Mar. 17, 2006

(65) Prior Publication Data
US 2007/0216485 A1   Sep. 20, 2007

(51) Int. Cl.
*H03F 3/68*  (2006.01)
(52) U.S. Cl. .................................. 330/295; 330/296
(58) Field of Classification Search ................ 330/86, 330/286, 295, 54, 277
See application file for complete search history.

(56) References Cited

U.S. PATENT DOCUMENTS

| | | | |
|---|---|---|---|
| 4,564,787 A | | 1/1986 | Kosmahi |
| 4,701,717 A | | 10/1987 | Radermacher et al. |
| 4,853,649 A | | 8/1989 | Seino et al. |
| 4,929,986 A | | 5/1990 | Yoder |
| 4,947,220 A | | 8/1990 | Yoder |
| 4,967,162 A | | 10/1990 | Barnett et al. |
| 5,012,203 A | | 4/1991 | Beyer et al. |
| 5,055,795 A | | 10/1991 | Kasper et al. |
| 5,208,547 A | * | 5/1993 | Schindler .................... 330/54 |
| 5,291,146 A | | 3/1994 | Friz |
| 5,349,306 A | | 9/1994 | Apel |
| 5,773,933 A | | 6/1998 | Yoder |
| 5,920,230 A | * | 7/1999 | Beall ............................ 330/54 |
| 6,049,250 A | * | 4/2000 | Kintis et al. ................. 330/54 |
| 6,094,099 A | | 7/2000 | Kobayashi |
| 6,369,648 B1 | | 4/2002 | Kirkman |
| 6,377,125 B1 | | 4/2002 | Pavio et al. |

(Continued)

FOREIGN PATENT DOCUMENTS

JP    04238407    1/1991

(Continued)

OTHER PUBLICATIONS

Ultrahigh Gain Gyrotron Traveling Wave Amplifier, K. R. Chu, H. Y. Chen, C. L. Hung, T. H. Chang, L. R. Barnett, S. H. Chen, T. T. Yang, vol. 81, No. 21; Nov. 23, 1998; pp. 4760-4763.

*Primary Examiner*—Robert Pascal
*Assistant Examiner*—Hieu P Nguyen

(57) ABSTRACT

An integrated circuit including a distributed amplifier is disclosed. The integrated circuit includes a plurality of amplification stages, each stage connected to an input signal and an output signal. At least one amplification stage includes an amplification transistor such as a field effect transistor (FET) having a gate, a source, and a drain, the gate connected to the input signal and a feedback path between the drain and the gate. The feedback path is implemented with another FET having a gate, a source, and a drain; its gate is connected to a control signal; its drain is connected to the drain of the amplification FET; and its source is connected to the gate of the amplification FET. The feedback path provides variable resistive feedback and allows the amplification FET to operate at its linear response portion of its characteristic curve even when its gain is controlled by a control signal.

13 Claims, 4 Drawing Sheets

U.S. PATENT DOCUMENTS

| | | |
|---|---|---|
| 6,788,148 B2 | 9/2004 | Orr et al. |
| 6,819,814 B2 | 11/2004 | Forrest et al. |
| 7,129,804 B2 * | 10/2006 | Hosoya .................. 333/33 |
| 2002/0011774 A1 | 1/2002 | Patterson et al. |
| 2004/0070455 A1 | 4/2004 | Hong et al. |
| 2004/0120626 A1 | 6/2004 | Komrumpf et al. |

FOREIGN PATENT DOCUMENTS

| | | |
|---|---|---|
| WO | WO-02/09277 | 1/2002 |

* cited by examiner

LINEAR VARIABLE GAIN TRAVELING WAVE AMPLIFIER

BACKGROUND

The present invention generally relates to electronic amplifiers. More particularly the present invention relates to linear variable gain traveling wave amplifiers.

Distributed amplifiers in general and traveling wave amplifiers (TWA) in particular are known in the art and are used in a variety of applications. FIG. 1 illustrates a prior art distributed amplifier 100 having an input impedance matching circuit 110, a output impedance matching circuit 120, and a plurality of amplification stages 132, 134, and 136. Each amplification stage, for example, the stage 132 includes an amplification field effect transistor (FET) 140 and a gain control FET 150.

In many microwave and mm-wave radio applications, gain control function is required to realize certain receiver or transmitter functions. For those applications, variable gain amplifiers have been using conventional variable gain TWA uses cascaded FET structure to obtain gain control function shown in FIG. 1. To control the amplifier gain, DC voltage for the Vcontrol terminal is changed.

In the illustrated example, the input impedance matching circuit 110 receives input voltage embodying input signal, Vin, and distributes the input signal to the gate 142 of the amplification FET 140. The amplification FET 140 is DC biased by ground on its source 144 and the output voltage Vout at its drain 146. The input signal Vin (now at the gate 142 of the amplification FET 140) controls drain-source current, Ids-140, between the drain 146 and the source 144 of the amplification FET 140, thereby controlling the output voltage embodying an output signal, Vout. Thus, the Ids-140 depends on the DC biasing of the drain 146 (of the amplification FET 140) relative to its source 144 (the DC biasing of drain-source is referred to as Vds) and the voltage at its gate relative to the voltage at the source (the DC biasing of gate-source is referred to as Vgs). In the illustrated example, the source is grounded and that the gate is connected to Vin; thus, Vgs is Vin.

The amplification FET 140 is serially connected to the gain control FET 150 in the illustrated cascade manner. The gain control FET receives a gain control signal, Vcontrol, at its gate 152. Vcontrol determines the drain-source current, Ids-150, between the drain 156 and the source 154 of the gain control FET 150. Because Vcontrol is a constant signal, and because amplification FET 140 is serially connected to the gain control FET 150, the effect of the gain control FET 150 is to limit the Ids-140 by preventing the full output voltage Vout from reaching the drain 146 of the amplification FET 140. A DC blocking capacitor 158 is used to isolate the Vcontrol signal from ground.

That is, changes in Vcontrol affect Ids-150 which, in turn, affects the DC biasing of the amplification FET 140 by changing the voltage at the drain 146 of the amplification FET 140. Further, the limitation of the Ids-150 limits the Ids-140. Changing of the DC biasing of the amplification FET 140 prevents the amplification FET 140 from operating at its linear portion of its operating characteristic curve. This is illustrated in FIG. 2.

FIG. 2 illustrates a graph illustrating the operating characteristic curve 200 representing operating characteristics of the amplification FET 140 as the drain-source current, Ids, in response to the gate-source voltage Vgs. As illustrated, a middle portion 202 of the operating characteristic curve 200 shows that at some preferred range of Vgs, the amplification FET 140 responds to the changes in the Vgs (due to Vin signal at the gate 144) with corresponding nearly linear changes of its Ids.

Also illustrated is another portions 204 of the operating characteristic curve 200 which show that at this range of Vgs, the amplification FET 140 responds to the changes in the Vgs (due to Vin signal at the gate 144) with a corresponding non-linear changes in its Ids. Such non-linear response is not desired because the non-linear response likely will lead to distortion of the input signal Vin as it is amplified by the distributed amplifier 100. As illustrated, generally, the FET 140 shows poor linearity when its drain current is low. The conventional variable gain TWA shows poor linearity when control the amplifier gain low.

In most applications of distributed amplifiers, it is desirable to have distortion free, linear responses to its input signals while still being able to control the gain of the distributed amplifier with a gain control signal, Vcontrol.

SUMMARY

The need is met by the present invention. In a first embodiment of the present invention, a distributed amplifier is disclosed. The distributed amplifier includes a number of components including an input impedance matching circuit; output impedance matching circuit; and a plurality of amplification stages. The input impedance matching circuit is adapted to receive an input signal and distribute it to the amplification stages. The output impedance matching circuit is connected to each amplification stage. At least one amplification stage includes an amplification FET, the amplification FET having a gate, a source, and a drain. The gate is connected to the input impedance matching circuit. The one amplification stage includes a feedback FET having a gate, a source, and a drain. Its gate is connected to a control signal; its drain is connected to the drain of the amplification FET; and its source is connected to the gate of the amplification FET.

The distributed amplifier may include a serially connected, impedance matching FET for impedance matching purposes. The input impedance matching circuit includes serially connected inductors terminated to ground. The input impedance matching circuit receives input signal for distribution to each of the plurality of amplification stages. The output impedance matching circuit includes serially connected inductors terminated to ground. The output impedance matching circuit connected to each of the amplification stages. The distributed amplifier is a traveling wave amplifier and can be implemented as a Gallium Arsenide microwave monolithic integrated circuit (MMIC) amplifier.

In a second embodiment of the present invention, an integrated circuit is disclosed. The integrated circuit includes a plurality of amplification stages, each stage connected to an input signal and an output signal. At least one amplification stage of the plurality of amplification stages includes an amplification transistor and a feedback path. The amplification transistor has a gate, a source, and a drain. The gate is connected to the input signal. The feedback path connects the drain and the gate of the amplification transistor. Degree of feedback of the feedback path controlled by a control signal.

The feedback path provides a negative feedback from the drain to the gate. The feedback path includes a circuit connected to the drain of the amplification transistor and the gate of the amplification transistor, the feedback circuit providing a variable resistive feedback between the drain and the gate of the amplification transistor. The resistance depends on the control signal. The amplification transistor is a field effect transistor (FET). The feedback path includes a feedback FET having a gate, a source, and a drain. The gate is connected to the control signal. The drain is connected to the drain of the amplification transistor. The source is connected to the gate of the amplification transistor.

Other aspects and advantages of the present invention will become apparent from the following detailed description, taken in conjunction with the accompanying drawings, illustrating by way of example the principles of the invention.

DETAILED DESCRIPTION

Figure 1:
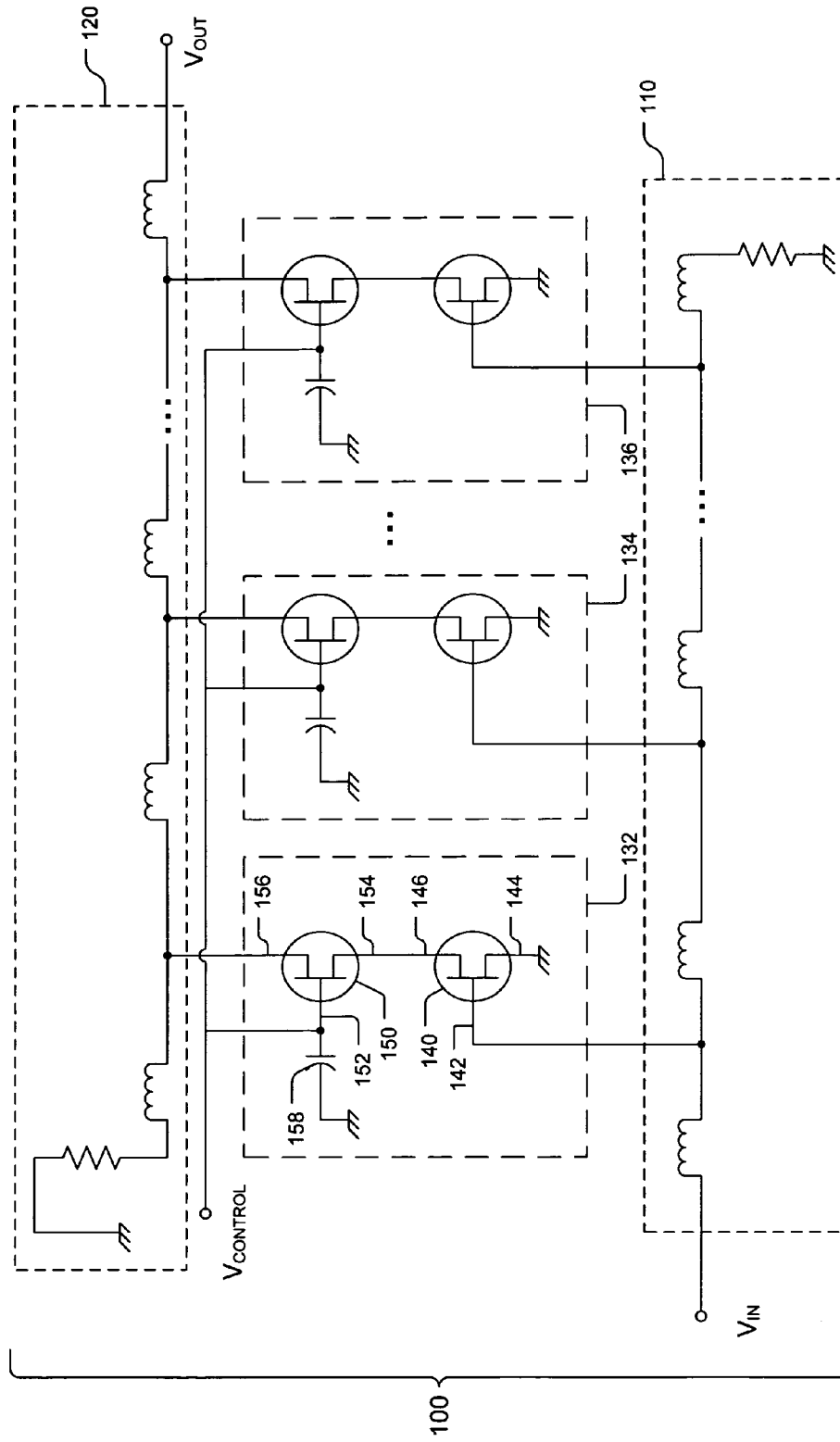
FIG. 1 is a diagram of a prior art distributed amplifier.

The present invention will now be described with reference to the Figures which illustrate various embodiments of the present invention. In the Figures, some sizes of structures or portions may be exaggerated and not to scale relative to sizes of other structures or portions for illustrative purposes and, thus, are provided to illustrate the general structures of the present invention. Furthermore, various aspects of the present invention are described with reference to a structure or a portion positioned "on" or "above" relative to other structures, portions, or both. Relative terms and phrases such as, for example, "on" or "above" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "on" or "above" other structures or portions would now be oriented "below," "under," "left of," "right of," "in front of," or "behind" the other structures or portions. References to a structure or a portion being formed "on" or "above" another structure or portion contemplate that additional structures or portions may intervene. References to a structure or a portion being formed on or above another structure or portion without an intervening structure or portion are described herein as being formed "directly on" or "directly above" the other structure or the other portion. Same reference number refers to the same elements throughout this document.

In one embodiment of the present invention an integrated circuit including a distributed amplifier including a plurality of amplification stages, each stage connected to an input signal and an output signal. At least one amplification stage of the plurality of amplification stages includes an amplification transistor having a gate, a source, and a drain. The gate is connected to the input signal, and the drain is connected to the output signal. There is a drain to source DC bias. A feedback path exists between the drain and the gate. The degree of feedback is controlled by a gain control signal, Vcontrol.

Here, gain control of the amplification transistor is not accomplished by limiting the drain-source current, Ids, of the amplification transistor. Rather, the gain control is accomplished by providing a negative feedback between the drain and the gate of the amplification transistor. By varying the degree of the feedback, amplification efficiency of the amplification transistor is controlled. However, feedback connection does not limit the drain-source current nor does it change the DC biasing of the amplification transistor. Accordingly, the amplification transistor is operated at the linear response portion of the operating characteristic curve. Thus, distortion free amplification of the personal has achieved the ability to control the game of the distributed amplifier.

Figure 3:
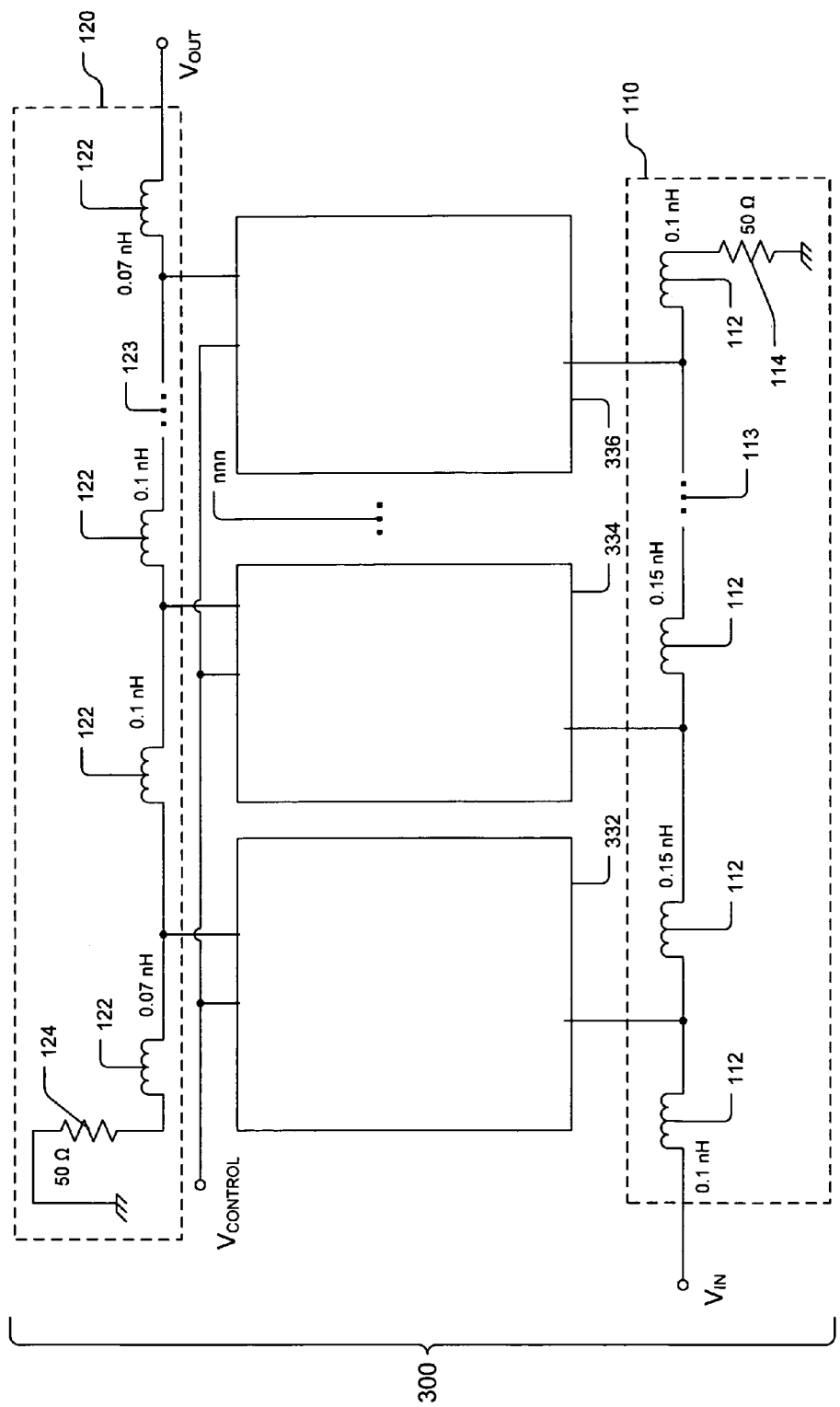
FIG. 3 is a diagram of the distributed amplifier according to one embodiment of the present invention.

FIG. 3 illustrates an integrated circuit 300 according to one embodiment of the present invention. Referring to FIG. 3, in the illustrated embodiment, the integrated circuit 300 is a distributed amplifier 300 such as a traveling wave amplifier (TWA) implemented as a Gallium Arsenide (GaAs) microwave monolithic integrated circuit (MMIC) amplifier.

The distributed amplifier 300 includes an input impedance matching circuit 110, an output impedance matching circuit 120, and a plurality of amplification stages 332, 334, and 336. As illustrated by an ellipsis 333, there may be more amplification stages than the illustrated amplification stages.

The input impedance matching circuit 110 includes a series of input inductors 112 and is terminated to ground by a terminating resistor 114 having, for example only, 50 ohm resistance. As illustrated by an ellipsis 113, the input impedance matching circuit 110 may include even more inductors than the illustrated inductors. In one example embodiment, the input inductors 112 have values range in the order of tenths of nano Henries, for example, 0.1 nano Henries to 0.2 nano Henries. The value of the inductors 112 depends on the desired characteristic of the input impedance matching circuit 110. The input impedance matching circuit 110 receives input voltage, Vin, embodying input signal, and distributes the input signal to each of the amplification stages.

The output impedance matching circuit 120 includes a series of output inductors 122 and is terminated to ground by a terminating resistor 124 having, for example only, 50 ohm resistance. As illustrated by an ellipsis 123, the output impedance matching circuit 120 may include even more inductors than the illustrated inductors. In one example embodiment, the output inductors 122 have values range in the order of tenths or hundreds of nano Henries, for example, 0.05 nano Henries to 0.1 nano Henries. The value of the inductors 122 depends on the desired characteristic of the output impedance matching circuit 120. The output impedance matching circuit 120 provides output voltage, Vout, as the bias voltage to each of the amplification stages, and also embodies the output signal.

Figure 4:
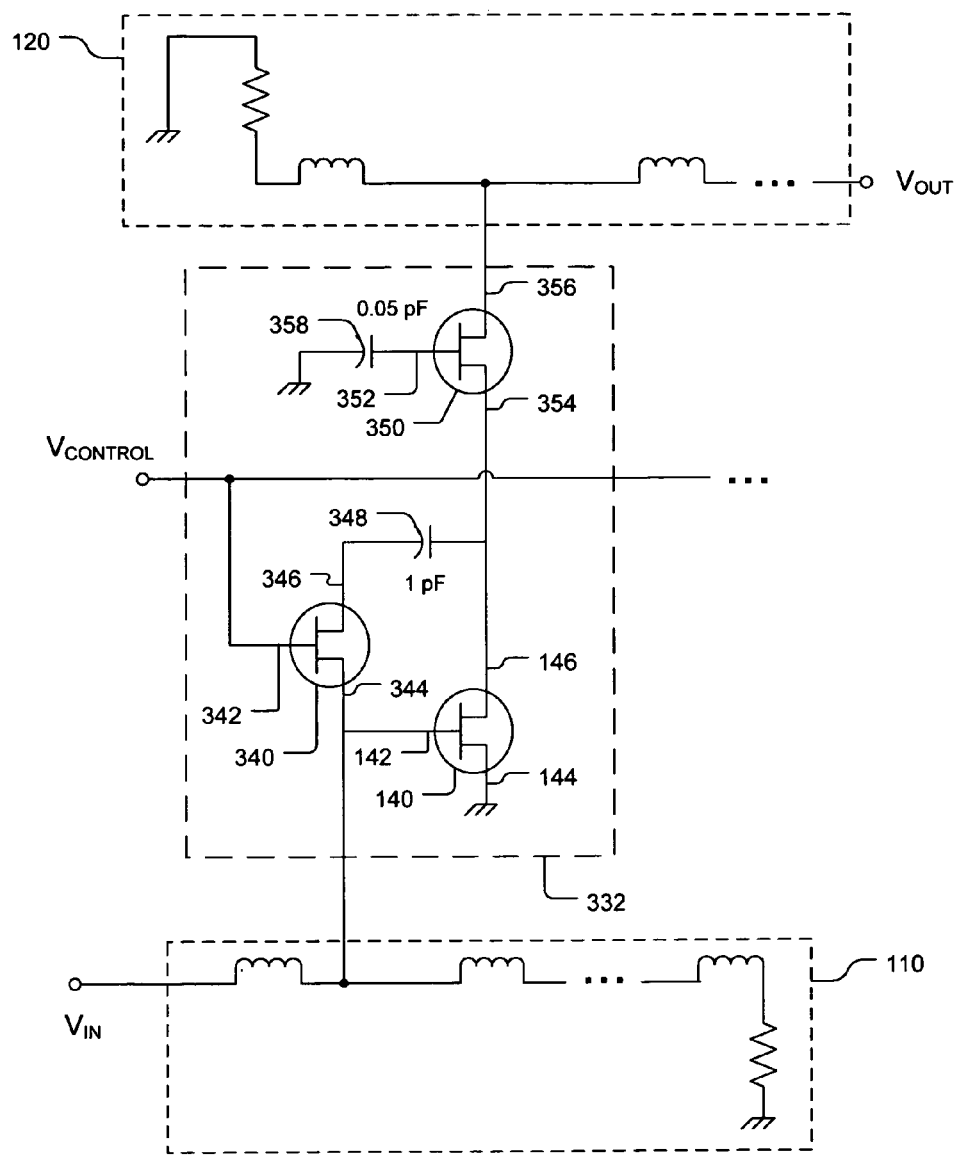
FIG. 4 illustrates portions of the distributed amplifier of FIG. 4 in more detail.

Each of the amplification stages 332, 334, and 336 is connected to the input and the output voltage and signal lines Vin and Vout. FIG. 4 illustrates the first amplification stage 332 in greater detail and also illustrates portions of the distributed amplifier 300 connected to the first amplification stage 332.

Referring to FIG. 4, the first amplification stage 332 includes an amplification transistor 140 having a gate 142, source 144, and drain 146. A feedback path exists between the drain 146 and the gate 142 of the amplification transistor 140. The degree of feedback of the feedback path is controlled by a gain control signal, Vcontrol.

In the illustrated sample embodiment, the feedback path includes a feedback FET 340 having a gate 342, a source 344, and a drain 346. The gate 342 is connected to the gain control signal. The drain 346 is connected to the drain 146 of the amplification FET via a feedback capacitor 348. The feedback capacitor 348 is provided as a DC blocking element between the gate 142 and the drain 146 of the amplification FET 140. The feedback capacitor 348 may have a wide range of capacitive values. In the illustrated example, the feedback capacitor 348 has capacitive value of one pico Farad as illustrated in the Figures. The source 344 is connected to the gate 142 of the amplification FET 140, the gate 142 being connected to the gain control signal.

Figure 2:
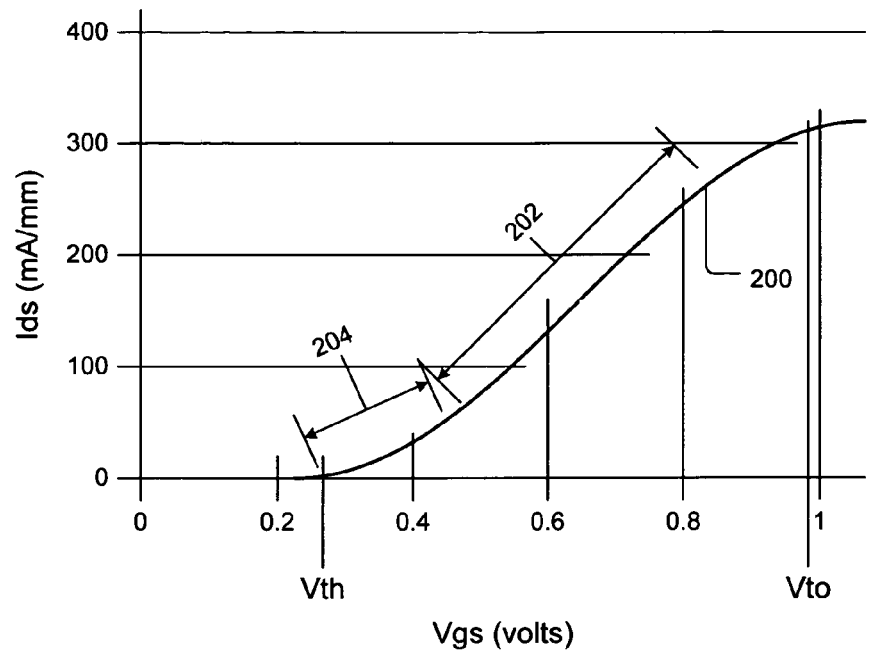
FIG. 2 is a graph illustrating an operating characteristic curve of an amplification transistor.

The operations of the distributed amplifier is as follows: When the Vcontrol is low, for example, zero volts, the feedback FET 340 behaves as an open circuit thereby providing no connection between the drain 146 and the gate 142 of the amplification FET 140. Here, with an appropriately selected Vout providing the drain-source DC bias (since source is connected to the ground) and an appropriately selected Vin providing (along with Vout) the drain-gate DC bias, the operating characteristics of the amplification FET 140 is as illustrated by the operating characteristic curve 200 of FIG. 2. Referring to FIGS. 2 and 4, furthermore, with the appropriately selected Vout and Vin, the amplification FET 140 operates within the linear portion 202 of the operating characteristic curve 200.

Vin can be, for example, up to +10 dBm of power at 10 ohm characteristic impedance. Vout is Vin plus amplifier power gain that is approximately 10 dB to 20 dB. For the RF circuit design, Vcontrol range is between threshold Vth and turn-on voltage Vto as illustrated in FIG. 2. Actual voltages depend on semiconductor processes and materials used.

To control the gain of the amplification FET 140, thus the gain of the entire distributed amplifier 300, the gain control signal is increased to another level, for example only, +1 volt (again, depending on the semiconductor processes and materials used).

In one PHEMT (Pseudomorphic High Electron Mobility Transistor) process, Vth is, for example only, 0.225 volts and Vto=0.97 v. At Vgs (of the feedback FET 340) at 1 v, the feedback FET 340 is fully on (closed) with relatively small resistance, thus creating a relatively high degree of feedback. As a result, the gain of the amplification FET 140 is minimized.

In effect, this provides for a resistive connection between the drain 146 and the gate 142 of the amplification FET 140, the resistive connection allowing for a negative feedback of electrical potential from the drain 146 of the amplification FET 140 to the gate 142 of the amplification FET 140. This changes the operating characteristic of the amplification FET 140 as illustrated by the operating characteristic curve 200 of FIG. 2.

The feedback from the drain 146 of the amplification FET 140 to its gate 142 is negative because, in FET operations, the signal at the gate is 180 degree from its output signal at the drain. Thus, the feedback between the drain and the gate reduces the gain of the FET.

Here, the Ids-140 is decreased for the entire range of the Vgs as illustrated by the operating characteristic curve 200. In this case, the Ids-140 is not limited by a serially connected FET (as was the case for the prior art distributed amplifier 100 of FIG. 1). Further, changes in the gain control signal Vcontrol does not change the drain-source DC bias of the amplification FET 140. For at least these reasons the amplification FET 140 continues to operate at the linear middle portion 202 of the operating characteristic curve 200. Consequently, there is less distortion of the input signal as it is amplified by the distributed amplifier 300.

Figure 5:
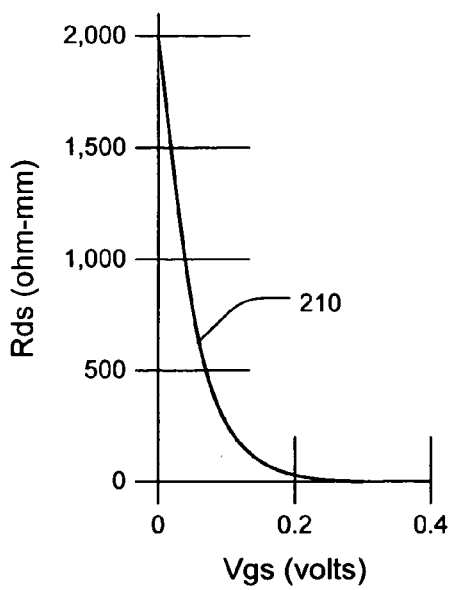
FIG. 5 is a graph illustrating sample equivalent resistance curve provided by a feedback path.

In short, the feedback path operates as a variable resistive feedback between the drain 146 and the gate 142 of the amplification transistor 140, the resistivity of which depends on the value of the control signal. FIG. 5 illustrates a curve 210 illustrating sample equivalent resistance provided by the feedback FET 340 as a function of Vgs (between the gate 342 and the source 344 of the feedback FET 340) at Vds (between the drain 346 and the source 344 of the feedback FET 340) at zero. As shown, as Vgs increase, the feedback FET 350 provides increasingly reduced resistance allowing for greater negative feedback.

Continuing to refer to FIG. 4, a common gate FET 350 is serially connected to the amplification FET 140. The common gate FET 350 is used to maintain the impedance matching condition for the output impedance matching circuit 120. Without common gate FET 350, the negative feedback path is directly connected to the output impedance matching circuit 120. Internal capacitance of the feedback FET 340 changes as the control voltage changes. This capacitance change creates impedance miss-match for the output impedance matching circuit 120. The common gate FET 350 has a gate 352, a source 354, and a drain 356. Its gate is connected to ground via a gate termination capacitor 358. Its source 354 is connected to the drain 146 of the amplification FET 140. Its drain 356 is connected to the output impedance matching circuit 120.

Referring to FIGS. 2 and 5, the actual values of voltages, current, and resistance are provided for the purposes of illustration and discussion and only as they relate to the illustrated example. These values may vary widely and will differ for different implementations, applications, and for apparatus made using different processes, with different materials, or both.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. A distributed amplifier, comprising:
  an input impedance matching circuit configured to receive an input signal;
  a plurality of amplification stages, each stage being operably connected to said input impedance matching circuit; and
  an output impedance matching circuit operably connected to each amplification stage of said plurality of amplification stages; and
  wherein at least one of said plurality of amplification stages comprises:
  an amplification FET having a gate, a source, and a drain, the gate being operably connected to said input impedance matching circuit;
  a feedback FET having a gate, a source, and a drain, the gate being configured to receive a control signal, the drain being operably connected to the drain of said amplification FET, and the source being operably connected to the gate of said amplification FET, and
  a common gate FET having a gate, a source, and a drain, the gate of the common gate FET being operably connected to ground, the source of the common gate FET being operably connected to the drain of the amplification FET, and the drain of the common gate FET being operably connected to the output impedance matching circuit.

2. The apparatus of claim 1, wherein said input impedance matching circuit comprises serially connected inductors terminated to ground, said input impedance matching circuit adapted to receive input signal for distribution to each of said plurality of amplification stages.

3. The apparatus of claim 1, wherein said output impedance matching circuit comprises serially connected inductors terminated to ground, said output impedance matching circuit connected to each of said plurality of amplification stages.

4. The apparatus of claim 1, wherein the distributed amplifier is a traveling wave amplifier.

5. The apparatus of claim 1, wherein the distributed amplifier is a GaAs microwave monolithic integrated circuit (MMIC) amplifier.

6. The apparatus of claim 1, wherein said one amplification stage further comprising an impedance matching FET.

7. The apparatus of claim 1, wherein the feedback FET forms a portion of a negative feedback path.

8. The apparatus of claim 7, wherein the feedback path comprises a circuit connected to the drain of said amplification transistor and the gate of said amplification transistor, said feedback circuit providing a variable resistive feedback between the drain and the gate of said amplification transistor.

9. The apparatus of claim 7, wherein said feedback path comprises a variable resistance circuit, the resistance depending on the control signal.

10. The apparatus of claim 1, wherein said input impedance matching circuit comprises serially connected inductors terminated to ground, said input impedance matching circuit being configured to receive the input signal for distribution to each of said plurality of amplification stages.

11. The apparatus of claim 1, wherein said output impedance matching circuit comprises serially connected inductors terminated to ground, said output impedance matching circuit being operably connected to each of said plurality of amplification stages.

12. The apparatus of claim 1, wherein the distributed amplifier is a traveling wave amplifier.

13. The apparatus of claim 1, wherein the distributed amplifier is a GaAs microwave monolithic integrated circuit (MMIC) amplifier.

* * * * *